United States Patent
Noguchi et al.

(10) Patent No.: US 6,709,776 B2
(45) Date of Patent: Mar. 23, 2004

(54) MULTILAYER THIN FILM AND ITS FABRICATION PROCESS AS WELL AS ELECTRON DEVICE

(75) Inventors: Takao Noguchi, Tokyo (JP); Yoshihiko Yano, Tokyo (JP); Hisatoshi Saitou, Tokyo (JP); Hidenori Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/842,805

(22) Filed: Apr. 27, 2001

(65) Prior Publication Data

US 2002/0015852 A1 Feb. 7, 2002

(30) Foreign Application Priority Data

Apr. 27, 2000  (JP) ......................... 2000-128231

(51) Int. Cl.$^7$ ................................. B32B 9/00
(52) U.S. Cl. ....................... 428/702; 428/701
(58) Field of Search ................. 428/446, 469, 428/689, 697, 699, 701, 702, 332; 117/937, 938, 84

(56) References Cited

U.S. PATENT DOCUMENTS

| | | | | |
|---|---|---|---|---|
| 5,470,668 A | * | 11/1995 | Wu et al. ............ | 428/688 |
| 5,753,934 A | * | 5/1998 | Yano et al. ............ | 257/30 |
| 5,801,105 A | | 9/1998 | Yano et al. | |
| 5,810,923 A | | 9/1998 | Yano et al. | |
| 5,828,080 A | | 10/1998 | Yano et al. | |
| 5,919,515 A | | 7/1999 | Yano et al. | |
| 5,955,213 A | * | 9/1999 | Yano et al. ............ | 428/450 |
| 6,045,626 A | | 4/2000 | Yano et al. | |
| 6,096,434 A | | 8/2000 | Yano et al. | |
| 6,121,647 A | | 9/2000 | Yano et al. | |
| 6,198,208 B1 | | 3/2001 | Yano et al. | |
| 6,258,459 B1 | * | 7/2001 | Noguchi et al. ........ | 117/944 |

FOREIGN PATENT DOCUMENTS

| | | |
|---|---|---|
| JP | 6-224068 | 8/1994 |
| JP | 7-193135 | 7/1995 |
| JP | 9-110592 | 4/1997 |
| JP | 10-17394 | 1/1998 |
| JP | 10-93036 | 4/1998 |
| JP | 10-223476 | 8/1998 |
| JP | 10-287494 | 10/1998 |
| JP | 11-26296 | 1/1999 |
| JP | 11-195768 | 7/1999 |
| JP | 11-274419 | 10/1999 |
| JP | 11-312801 | 11/1999 |
| JP | 11-322424 | 11/1999 |

OTHER PUBLICATIONS

G. A. Rossetti, Jr., et al., Appl. Phys. Lett., vol. 59, No. 20, pps. 2524–2526, "Stress Induced Shift of the Curie Point in Epitaxial PbTiO$_3$ Thin Films," Nov. 11, 1991.

Y. Yano, et al., J. Appl. Phys., vol. 76, No. 12, pps. 7833–7838, "Epitaxial Growth and Dielectric Properties of BaTiO$_3$ Films on Pt Electrodes by Reactive Evaporation," Dec. 15, 1994.

T. Kawakubo, et al., IEEE Electron Device Letters, vol 18, No. 11, "Novel Ferroelectric Epitaxial (Ba, Sr) TiO$_3$ Capacitor for Deep Sub–Micron Memory Applications," Nov. 1997.

T. Kawakubo, et al. Jpn. J. Appl. Phys. vol. 37 No. 9B, pps. 5108–5111 Part 1, "Ferroelectric Properties of SrRuO$_3$/(Ba,Sr)TiO$_3$/SrRuO$_3$ Epitaxial Capacitor," Sep. 1998.

\* cited by examiner

Primary Examiner—Deborah Jones
Assistant Examiner—Arden Sperty
(74) Attorney, Agent, or Firm—Oblon, Spivak, McClelland, Maier & Neustadt, P.C.

(57) ABSTRACT

The invention has for its objects to provide a multilayer thin film comprising a ferroelectric thin film preferentially (001) oriented on an Si substrate, its fabrication process, and an electron device. To attain these object, the invention provides a multilayer thin film formed on a substrate by epitaxial growth, which comprises a buffer layer comprising an oxide and a ferroelectric thin film, with a metal thin film and an oxide thin film formed in this order between the buffer layer and the ferroelectric thin film, its fabrication process, and an electron device.

14 Claims, 8 Drawing Sheets

MULTILAYER THIN FILM AND ITS FABRICATION PROCESS AS WELL AS ELECTRON DEVICE

BACKGROUND OF THE INVENTION

1. Art Field

The present invention relates to a multilayer thin film including a ferroelectric thin film and an electron device comprising such a multilayer thin film. Typically, the multilayer thin film may be applied to semiconductor memories, thin-film ferroelectric devices such as infrared sensors, recording media for recording information by polarization reversal of ferroelectrics by AFM (atomic force microscope) probes or the like, thin-film vibrators, thin-film VCOs and thin-film filters used for mobile communications equipment, thin-film piezoelectric devices used for liquid injectors or the like.

2. Background Art

Electronic devices comprising dielectric films, ferroelectric films, piezoelectric films or the like formed and packed on Si substrates or semiconductor crystal substrates have been invented and intensively studied. For instance, LSIs having ever higher packing densities and dielectric separated LSIs using SOI technologies have been invented through combinations of semiconductors and dielectric materials, semiconductors storage devices such as nonvolatile memories through combinations of semiconductors and ferroelectric materials, film bulk acoustic resonators or FBARs, thin-film VCOs, thin-film filters, etc. through combinations of semiconductor substrates and piezoelectric films.

To allow such electron devices to have the optimum device performance and its reproducibility, it is desired that single crystals be used as dielectric materials, ferroelectric materials and piezoelectric materials. The same goes for thin-film materials. With polycrystal materials, it is difficult to obtain satisfactory device performance for the reason of physical quantity disturbances due to grain boundaries, and so epitaxial films as close to perfect single crystals as possible are now desired. A requirement for FBAR devices is that they be formed on Si single crystal substrates because the substrates should be processed with high accuracy. In addition, when ferroelectric materials such as PZT are used as FBAR materials, it is believed that the largest output is obtained when the spontaneous polarization of a ferroelectric material lines up in one direction. For this reason, it is ideally desired that a (001) uniaxially oriented ferroelectric thin film be formed on an Si single crystal substrate by epitaxial growth.

Typical ferroelectric thin films include those of $PbTiO_3$, PZT, $BaTiO_3$, etc. To apply these perovskite oxide thin films to actual devices, it is required to form them on semiconductor substrates. However, it is very difficult to form a uniaxially oriented ferroelectric thin film such as a (001) uniaxially oriented $BaTiO_3$ film of good crystallographic properties on a semiconductor substrate such as an Si (100) substrate. To overcome such difficulty, the inventors have filed patent applications (JP-A 09-110592, etc.) to come up with a process wherein a ferroelectric epitaxial thin film can be easily formed on an Si single crystal substrate.

Usually, however, a ferroelectric thin film formed on an Si substrate as an example have properties vastly inferior to those derived from ferroelectric's own properties. The properties of a ferroelectric material, e.g., dielectric constant, Curie temperature, coercive electric field and residual polarization change with stresses that the ferroelectric material has. A thin-film form of ferroelectric material is likely to generate stresses in association with film formation, and so stress control is of importance to form a ferroelectric thin film having improved properties. Stresses in particular have a great influence on the deterioration of the properties of a ferroelectric thin film formed on an Si substrate.

For instance, J.A.P. 76(12), 15, 7833 (1994) and A.P.L. 59(20), 11, 2524 (1991) teach that two-dimensional stresses in a film plane have a strong influence on the properties of a ferroelectric material on an MgO single crystal substrate, not an Si single crystal substrate. A leading cause for stress generation is a difference between the underlying substrate and the ferroelectric in physical properties, e.g., the coefficient of thermal expansion and lattice constant. To apply a ferroelectric thin film to a device, therefore, any desired ferroelectric properties cannot be stably obtained without such stress reductions as mentioned above.

Here ferroelectric materials having preferred properties include Pb-base ferroelectric materials such as $PbTiO_3$, PLT ($PbTiO_3$ with La added thereto), PZT ($PbZrO_3$—$PbTiO_3$ solid solution) and PLZT ($PbZrO_3$—$PbTiO_3$ solid solution with La added thereto). The Pb-base ferroelectric materials, for the most part, have their axes of polarization in the [001] direction; they should preferably be uniaxially oriented films in terms of ferroelectric properties. When a Pb-base ferroelectric thin film is formed on an Si single crystal substrate, however, a domain structure is likely to occur, in which structure (001) oriented crystals coexist with (100) oriented crystals.

Set out below is one possible reason why the Pb-base ferroelectric domain structure is easily formed on the Si single crystal substrate. In what follows, PZT is used as an example of the Pb-base ferroelectric material.

Si is much smaller in the coefficient of thermal expansion than PZT. Accordingly, if a PZT thin film is formed at a temperature of 600° C. for instance, the contraction of the PZT thin film is then disturbed by the Si substrate in the process of cooling the thus formed thin film down to room temperature and, as a result, relatively large two-dimensional tensile stresses are generated within the plane of the PZT thin film. To make up for such tensile stresses, PZT must be forcibly formed into a 90° degree domain structure film in which (001) oriented crystals coexist with (100) oriented crystals. As the PZT thin film is cooled down, the tensile stresses remain generated therein even after domain formation and so the ferroelectric properties thereof become low.

The same holds true for the case where the PZT thin film is used as a piezoelectric material. To enhance the piezoelectric properties of the PZT thin film, it is of importance to increase the proportion of the (001) oriented crystals as much as possible, and to reduce the tensile stresses on the PZT thin film as much as possible.

On the other hand, the inventors have proposed a process for obtaining a ferroelectric thin film having a tetragonal (001) orientation while making use of elastic distortion resulting from a difference in lattice constant between both, called a misfit, as set forth in JP-A's 10-223476 and 11-26296, wherein a perovskite oxide thin film is formed on an electrically conductive oxide thin film. With this process, it is possible to form on an Si (100) substrate a (001) uniaxially oriented ferroelectric thin film of several tens of nanometers in thickness.

IEEE ELECTRON DEVICE LETTERS, Vol. 18 (1997), pp. 529–531, Jpn. J. Appl. Phys. Vol. 137 (1988), pp. 5108–5111 and JP-A 11-274419, too, describe that as in the aforesaid process, a perovskite oxide such as BSTO is formed on an electrically conductive oxide such as $SrRuO_3$, whereby a dielectric film is elongated in the c-axis direction while making use of elastic distortion due to the misfit. Likewise, it is possible to obtain a ferroelectric film of several tens of nanometers in thickness having the (001) direction.

In this regard, it is noted that the effect of elastic distortion due to the misfit becomes slender with increasing film thickness, because of being absorbed by rearrangement. When a thin film is used as a capacitor or the like, it is unnecessary to increase film thickness except for the purpose of reducing leakage. To use a ferroelectric thin film in the form of a piezoelectric film for thin-film bulk vibrators as an example, it is required to make use of resonance in the thickness direction of the thin film. To be more specific, a thickness of the order of at least several hundred nanometers is needed for obtaining a frequency range of 1 GHz to 5 GHz capable of taking full advantage of the thin-film bulk vibrator, although varying with the frequency used. At such a thickness, the effect of elastic distortion due to the misfit vanishes into almost nothing; any satisfactory piezoelectric properties are no longer achieved. If use is made of a process wherein, as shown in JP-A 10-287494 assigned to the applicant, a ferroelectric thin film and an electrically conductive oxide thin film are repeatedly laminated together at a thickness at which the elastic distortion in the ferroelectric thin film is not relaxed, then the thickness of the ferroelectric layer may be effectively increased. However, this makes the fabrication process complicated, and offers some problems as well. For instance, resonance characteristics become worse due to the presence of many layer interfaces in the ferroelectric thin film. It is thus required to improve the 90° domain structure in the ferroelectric film with the number of lamination close to a single layer, thereby bringing ferroelectric crystals as close to the (001) uniaxial orientation as possible.

SUMMARY OF THE INVENTION

As already mentioned, the two-dimensional large tensile stresses remain within the plane of a current ferroelectric thin film formed on an Si single crystal substrate. Especially with a ferroelectric thin film having a thickness of as large as several hundred nanometers, it is not possible to obtain sufficient spontaneous polarization values or piezoelectric properties.

It is therefore an object of the invention to provide a multilayer thin film including a preferentially (001) oriented ferroelectric thin film having any desired thickness on an Si substrate, and its fabrication process. If a preferentially (001) oriented ferroelectric thin film having any desired thickness can be formed on an Si single crystal substrate that is a semiconductor substrate, it is then very advantageously applicable to a variety of electron devices inclusive of thin-film vibrators, thin-film VCOs and thin-film filters used for mobile communications equipment, thin-film piezoelectric devices used for liquid injectors, etc., semiconductor memories, thin-film ferroelectric devices such as infrared sensors or recording media for recording information by inversion of polarization of a ferroelectric material by an AFM (atomic force microscope) probe or the like.

Such an object is attained by the following embodiments (1) to (12) of the invention.

(1) A multilayer thin film formed on a substrate by epitaxial growth, which comprises a buffer layer comprising an oxide and a ferroelectric thin film, with a metal thin film and an oxide thin film formed in this order between said buffer layer and said ferroelectric thin film.

(2) The multilayer thin film of (1) above, wherein said oxide thin film has electrical conductivity.

(3) The multilayer thin film of (1) or (2) above, wherein an oxide thin film is formed on said ferroelectric thin film.

(4) The multi layer thin film of any one of (1) to (3) above, wherein said oxide thin film is a perovskite oxide.

(5) The multilayer thin film of any one of (1) to (4) above, wherein an a-axis lattice constant of a material used for said oxide thin film is smaller than an a-axis lattice constant of a material used for said ferroelectric thin film.

(6) The multilayer thin film of any one of (1) to (5) above, wherein said metal thin film contains at least one of Pt, Ir, Pd, Rh and Au.

(7) The multilayer thin film of any one of (1) to (6) above, wherein said metal thin film has a thickness of 50 to 500 nm.

(8) The multilayer thin film of any one of (1) to (7) above, wherein said ferroelectric thin film contains Pb and Ti.

(9) The multilayer thin film of any one of (1) to (8) above, wherein said buffer thin film contains zirconium oxide, a rare earth element oxide or zirconium oxide with a part of Zr substituted by a rare earth element or an alkaline earth element.

(10) The multilayer thin film of anyone of (1) to (9) above, wherein said substrate is an Si (100) single crystal substrate.

(11) An electron device comprising a multilayer thin film as recited in any one of (1) to (10) above.

(12) A process for fabricating a multilayer thin film by:
forming a buffer layer comprising an oxide on a substrate by epitaxial growth,
forming a platinum metal thin film thereon, and then forming an electrically conductive perovskite oxide thin film on the platinum metal thin film by epitaxial growth, and
forming a ferroelectric thin film on the perovskite oxide thin film by epitaxial growth.

ACTION

By forming a metal thin film and an oxide thin film between the Si substrate and the ferroelectric thin film in this order, stresses applied on the ferroelectric thin film are relaxed, thereby obtaining a preferentially (001) oriented film.

In what follows, the action of the invention is explained.

A PZT formed on an Si substrate is likely to have a domain structure with the (001) orientation coexisting with the (100) orientation by virtue of tensile stresses due to the Si substrate during the cooling process from the film-formation temperature down to room temperature. Even after domain formation, the tensile stresses increase continuously in the cooling process, and so cause two-dimensional elastic deformation of the film. This in turn decreases the lattice constant of the film in a direction vertical with respect to a film plane, and so causes the properties of the (001) oriented portion to become further worse. To avoid such domain formation and deformation due to the tensile stresses, JP-A's 10-223476 and 11-26296 published under the name of the applicant show a process wherein during film formation, a film is compressed using the misfit, thereby compensating for the tensile stresses during cooling. However, this process is found to be only effective at up to several tens of nanometers where elastic distortion due to the misfit does not vanish. One possible effective way for reducing tensile stresses at larger film thicknesses is to absorb the tensile stresses on the ferroelectric thin film by the underlying structure.

When a tetragonal ferroelectric material is formed directly on a metal thin film such as a Pt thin film, it is possible to relax stresses due to a thermal expansion difference between the Si substrate and the ferroelectric film, because the metal thin film is amenable to plastic deformation. Since such stresses are not completely relaxed, however, tensile stresses are still applied to the ferroelectric, and so domain formation and a decrease in the lattice constant in the vertical direction are unavoidable. When the lattice constant of the metal thin film within the film plane is smaller than that of the ferroelectric as found in a Pt-PZT combination, the ferroelectric is subject to elastic distortion due to the misfit between the metal thin film and the ferroelectric thin film. For this reason, it is expected that the lattice constant of the ferroelectric in the vertical direction with respect to the film plane may be extended or the proportion of the (001) domains with respect to the (100) domains may increase. However, no sufficient effect is still obtainable because a metal is generally easier to deform than a ferroelectric material; that is, most of elastic deformation is absorbed by deformation and rearrangement in the metal thin film.

On the other hand, when a ferroelectric thin film is formed on an oxide thin film such as an electrically conductive perovskite oxide formed directly, or via an oxide buffer layer, on an Si substrate, it is possible to prevent the ferroelectric thin film from having domains or deforming by the effect of distortion due to the misfit on condition that the ferroelectric thin film has a small film thickness. As the film thickness increases to several hundred of nanometers or more, however, this effect disappears; in other words, the film grows at the lattice constant inherent in the ferroelectric thin film material. As this multilayer thin film is cooled down to room temperature, tensile stresses resulting from the substrate are transmitted to the ferroelectric thin film without being substantially relaxed because of the absence of any metal or other soft material layer between the ferroelectric thin film and the substrate. As a result, the domains formed or deformation rather becomes large. In addition, another problem such as cracking may possibly arise.

According to the present invention, therefore, between the ferroelectric thin film and the substrate a layer comprising a metal thin film and an oxide layer having a coefficient of thermal expansion close to or higher than that of the aforesaid ferroelectric thin film are interposed. The oxide layer is much more contracted than the Si substrate during cooling because the coefficient of thermal expansion of the oxide layer is larger than that of Si. If this layer is a cubic crystal system, the degree of contraction can be much more increased, because the layer cannot have any domain; stresses cannot be relaxed by domains formed within the film. In addition, the oxide layer is less susceptible to deformation, and so contraction-inducing force is efficiently transmitted to the underlying metal layer without being absorbed by deformation within the film. Consequently, the stresses between the Si substrate and the oxide layer are absorbed by rearrangement within the metal layer interposed therebetween or slips in the vicinity of interfaces. As a result, the tensile stresses coming from the substrate and acting on the ferroelectric film become weaker as compared with the case where the underlying layer is composed solely of the metal thin film, and so it is possible to prevent the ferroelectric film from having domains or reduce a decrease in the lattice constant of the ferroelectric film in the vertical direction. Further, this effect is much more enhanced, if another oxide thin film is formed on the ferroelectric film, because the ferroelectric film can receive compressive stresses from the overlying film.

Furthermore, when the a-axis lattice constant of the material used for the oxide thin film is smaller than the a-axis lattice constant of the material used for the overlying ferroelectric thin film, the effect of elastic distortion due to the misfit can be added to the ferroelectric thin film, so that the ferroelectric film can be elongated in the c-axis direction, with efficient (001) orientation.

EXPLANATION OF THE PREFERRED EMBODIMENTS

Figure 1:
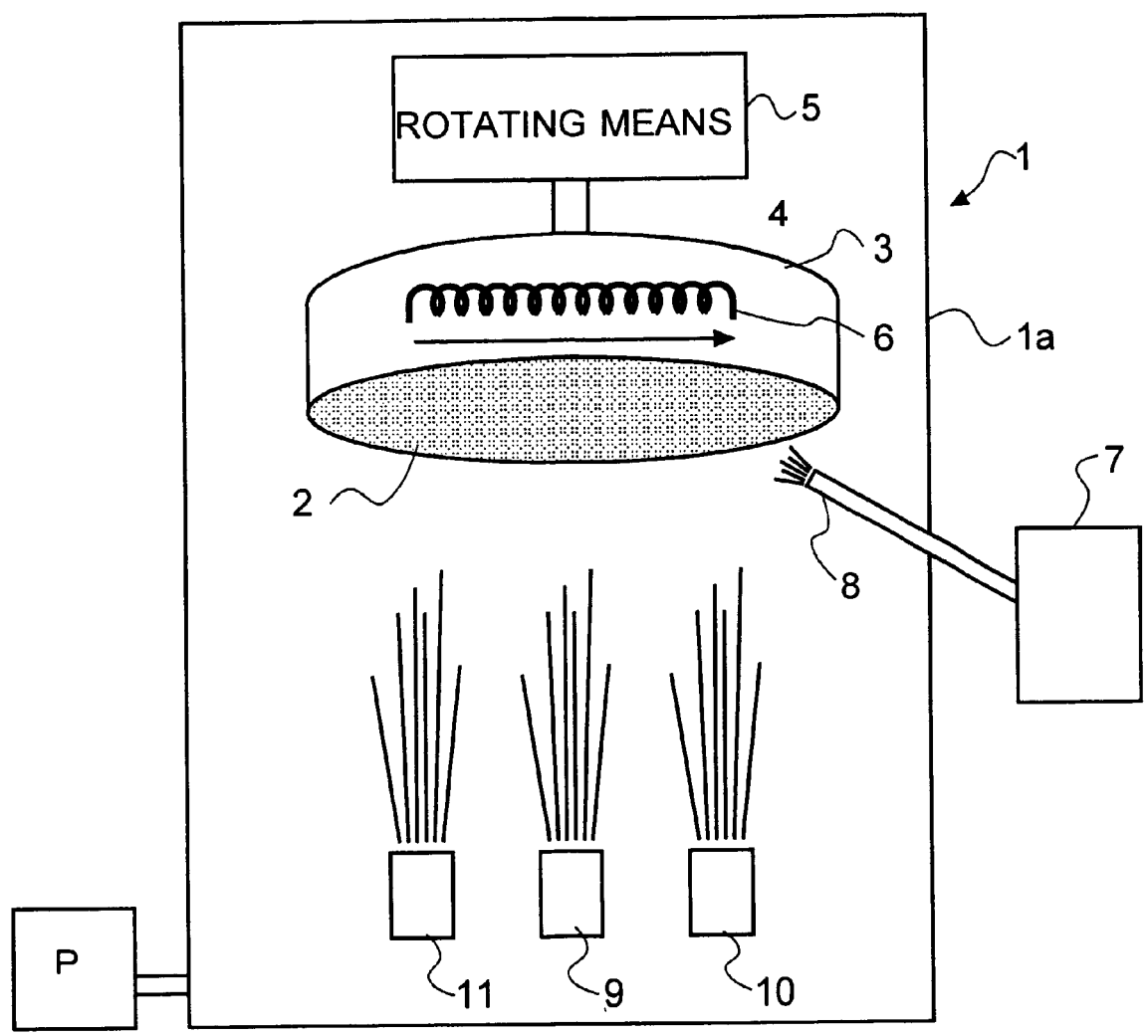
FIG. 1 is illustrative of one example of the evaporation system used to form the multilayer thin film according to the invention.

In the multilayer thin film according to the present invention, a buffer layer comprising an epitaxially grown oxide and a ferroelectric thin film are formed on a substrate comprising an Si single crystal or the like. At least one metal thin film layer and at least one oxide thin film layer are interposed between the buffer layer and the ferroelectric thin film.

Herein, that a thin film has the (001) orientation, for instance, is understood to mean that the (001) plane is present substantially parallel with a film plane.

The "uniaxially oriented film" used herein is understood to refer to a crystallized film wherein the desired crystal planes line up parallel with the surface of the substrate. To be more specific, the uniaxially oriented film means a film in which, as measured by X-ray diffraction (XRD), the reflection peak intensity of a plane other than the desired plane is up to 10%, preferably up to 5% of the maximum peak strength of the desired one. In the (00L) uniaxially oriented film, typically, the c-plane uniaxially oriented film, the reflection intensity of a plane other than the (00L) plane is up to 10%, preferably up to 5% of the reflection maximum peak intensity of the (00L) plane, as measured by 2θ-θ X-ray diffraction. It is herein appreciated that (00L) is a general notation for the (001) series of planes, viz., equivalent planes such as (001) and (002).

First of all, the epitaxial film used herein must be such a uniaxially oriented film as mentioned above. The second condition for the epitaxial film used herein is that when a film plane is defined by an x-y plane and a film thickness direction is defined by a z-axis, all crystals line up in alignment with the x-, y- and z-axis directions. The presence of such orientations may be ascertained by a spot or streak form of sharp pattern as evaluated by RHEED. For instance, when there are disturbances in the crystal orientations on the buffer layer having surface asperities, a RHEED image does not exhibit any sharp spot, and tends to elongate in a ring form. A certain thin film, if it satisfies the aforesaid two conditions, can then be thought of as an epitaxial film.

The "epitaxially grown film" used herein is understood to include not only an epitaxial film but also a thin film that is an epitaxial film in the growth process but has a domain structure at room temperature. A tetragonal perovskite oxide thin film such as a PZT thin film grows in the form of a cubic (100) epitaxial film at a growth temperature; however, this cubic phase is transited to a tetragonal phase in the post-growth cooling process, yielding a 90° domain structure film with the (100) orientation coexisting with the (001) orientation.

Some embodiments of the invention are now explained in detail.

Buffer Layer

The buffer layer used herein is an oxide single layer or a multilayer comprising a plurality of oxides. The buffer layer is interposed between the metal thin film and the substrate to take a role in the high-quality epitaxial growth of the metal film on the Si substrate. Further, this buffer layer functions as both an insulator and an etching stopper layer during via hole etching for FBAR devices, etc. Furthermore, the buffer layer interposed between the metal thin film and the substrate is effective for preventing reactions between the metal thin film and the substrate, and formation of suicides especially when Si is used for the substrate.

To obtain a ferroelectric thin film of good-enough crystallographic properties, it is required to form an electrode film in the form of an epitaxial film close to a single crystal. To meet such requirements, it is preferable to use a process as set forth in JP-A 09-110592 published under the names of the inventors, viz., a process wherein a layer including a $ZrO_2$ thin film having the (001) orientation, a stabilized zirconia thin film, a rare earth element oxide thin film, etc. is formed on an Si single crystal substrate, a perovskite layer comprising $BaTiO_3$, etc. and having the (001) orientation is formed on the layer, and a metal thin film comprising Pt, etc. is formed as an electrode film on the perovskite layer. The reason for the provision of the perovskite layer is that when the Pt thin film is formed directly on the $ZrO_2$ (001) thin film, Pt has the (111) orientation or assumes a polycrystal form and so fails to yield any Pt (100) uniaxially oriented film. This is because for the reason of large lattice mismatching between the $ZrO_2$ (001) plane and the Pt (100) plane, Pt grows using the energetically stable (111) plane as a growth plane rather than grows epitaxially, i.e., using the (100) plane as a growth plane.

For the buffer layer and the metal thin film, it is acceptable to use a multilayer thin film as set forth in JP-A 11-312801.

For the multilayer thin film disclosed in this publication, it is unnecessary to form a multi-composition perovskite thin film such as a $BaTiO_3$ thin film, because a metal thin film has already been formed on a buffer layer having facets. For this reason, it is possible to fabricate an epitaxial metal thin film of good-enough crystallographic properties in a much easier manner. The buffer layer set forth in the aforesaid publication is characterized in that its interface with the metal thin film includes the {111} facet plane. This buffer layer is an epitaxial film having the cubic (100) orientation, the tetragonal (001) orientation or the orthorhombic (001) orientation and, hence, its facet plane is the {111} facet plane. The metal thin film grows epitaxially in the form of the {111} oriented film on the {111} facet plane of the buffer layer. As the metal thin film grows, the pits defined by facet planes are filled up. Eventually, the surface of the metal thin film becomes flat and parallel with the surface of the substrate. Although this surface provides the cubic (100) plane, yet it sometimes provides the tetragonal (001) plane depending on distortion, etc. of crystal lattices.

It is here noted that in the process of buffer layer formation, an $SiO_2$ layer may possibly occur between the buffer layer and the Si substrate. However, this $SiO_2$ layer is regarded as being formed by the oxidization of the surface of Si after the buffer layer starts to grow epitaxially and, hence, does not inhibit the epitaxial growth of the buffer layer. Thus, the presence of this $SiO_2$ layer is acceptable.

Metal Thin Film

The metal thin film functions as a part of the structure for absorbing the tensile stresses acting on the ferroelectric thin film from the Si substrate. When the multilayer thin film of the invention is used as a component of an electron device, the metal thin film also functions as an electrode. If a piezoelectric thin film or the like is formed on the metal thin film with an epitaxial cubic oxide interposed therebetween, then a variety of electron devices such as thin-film bulk resonators having satisfactory properties can be achieved.

The metal thin film formed on the surface of the buffer layer, on which the facet planes are present, grows while the pits defined by the facet planes are filled up, as mentioned above. Eventually, the surface of the metal thin film becomes flat and parallel with the surface of the substrate.

Usually, the metal thin film is in the form of a cubic epitaxial film with the (100) plane oriented parallel with the surface of the film. However, this metal thin film is sometimes in the form of an epitaxial film having typically the tetragonal (001) orientation, which may occur by deformation of crystals due to stresses.

The metal thin film should preferably be excellent in heat resistance at the film-formation temperature of the ferroelectric material, and in plasticity for stress absorption as well. To be more specific, the metal thin film should comprise as a primary component preferably at least one of Pt, Ir, Pd, Rh and Au, and more preferably either one of Pt and Au. The metal thin film should preferably be composed of a pure form of such metals or an alloy containing them. It is acceptable to form the metal thin film using two or more thin films having different compositions.

The metal thin film should have a thickness of preferably 50 to 500 nm, and more preferably 50 to 200 nm. At too small a thickness, the absorption of stresses by the deformation of the metal thin film becomes insufficient, and the crystallographic properties and surface properties of the metal thin film are impaired as well. At too large a thickness, the resonance properties of the metal thin film are impaired when the multilayer thin film is used for a piezoelectric device such as an FBAR. When the buffer layer with the surface composed of facet planes is used, sufficient surface flatness is achievable by using a metal thin film of 50 nm or more in thickness to fill up the surface asperities of the buffer layer. To allow the metal thin film to function well as an electrode, the metal thin film should preferably have a thickness of 50 to 500 nm.

It is here noted that the metal thin film should have a specific resistance of preferably $10^{-7}$ to $10^3$ Ωcm, and more preferably $10^{-7}$ to $10^{-2}$ Ωcm.

Oxide Thin Film

The oxide thin film is formed on and in contact with the metal oxide thin film, and cooperates with the metal thin film to relax and control tensile stresses. The provision of another oxide thin film on the ferroelectric thin film is effective to improve the properties of the ferroelectric thin film because two-dimensional compressive stresses can be applied to the ferroelectric thin film.

To better the crystallographic properties of the overlying ferroelectric thin film, the oxide thin film should be formed epitaxially with respect to the metal thin film. This thin film should preferably have the cubic (100) uniaxial orientation or the tetragonal (001) uniaxial orientation. When the oxide thin film is formed on the Si substrate, distortion due to stresses may cause crystals to deform or have domains. It is thus acceptable that the cubic (100) oriented film may be transformed into the tetragonal (001) oriented film or may have a 90° domain structure having the cubic (001) and (100) orientations.

It is preferred that the material for the oxide thin film, for instance, includes those having a $CaF_2$ structure, a rare earth c type structure, a pyrochlore structure, an NaCl structure and a perovskite structure. Since most of ferroelectric materials have a perovskite structure, however, it is particularly preferable to use a perovskite oxide fit for crystal matching with respect to the ferroelectric material. Most preferably, an electrically conductive perovskite oxide thin film should be used. If the conductive perovskite oxide film is used, it is then possible to apply voltage efficiently to the overlying ferroelectric thin film, because it can also function as a lower electrode in cooperation with the metal thin film (Pt). The perovskite oxide thin film should preferably be formed of an electrically conductive perovskite oxide such as $SrTiO_3$, lead titanate containing a rare earth element and $SrRuO_3$.

The oxide thin film should preferably have electrical conductivity. The oxide thin film has a specific resistance of the order of preferably $10^3$ Ωcm or less, and more preferably $10^{-6}$ to $10^{-2}$ Ωcm.

When the a-axis lattice constant of the material used for the oxide thin film is smaller than the a-axis lattice constant of the material used for the ferroelectric thin film formed thereon, the ferroelectric film can be elongated in the c-axis direction by making use of the elastic distortion due to the misfit. It is thus possible to obtain a ferroelectric film (001) oriented from the interface between the oxide thin film and the ferroelectric thin film to a thickness of several tens of nanometers.

The oxide thin film has a thickness of preferably 30 to 500 nm, and more preferably 50 to 200 nm. At too small a thickness, no sufficient effect of contraction is obtainable and the absorption of stresses from the substrate becomes insufficient as well. At too large a thickness, the resonance properties of the oxide thin film are impaired when the multilayer thin film is used for a piezoelectric device such as an FBAR, as in the case of the metal thin film.

The oxide thin film may be a single layer film or a multilayer film. For instance, the oxide thin film may include an oxide layer which may formed by the oxidation of a part of the underlying metal thin film in the process of oxide thin film fabrication or after oxide thin film formation. It is also acceptable to form a thin film comprising tetragonal crystals, etc. between the oxide thin film and the metal thin film. For instance, the oxide thin film may have a structure where $SrRuO_3$ is stacked on $BaTiO_3$ formed on Pt.

Another metal thin film may be formed on the oxide thin film. A plurality of stacks, each comprising the metal thin film and the oxide thin film, may be laminated together. These are effective to relax stresses. When the stacks are laminated together, the layer contiguous to the ferroelectric thin film may be either one of the oxide thin film and metal thin film.

The oxide thin film formed on the ferroelectric thin film has no influence on the crystallographic properties of the ferroelectric thin film, because it is provided after the formation of the ferroelectric thin film. Accordingly, this oxide thin film is not necessarily an epitaxial layer. However, the oxide thin film should preferably be an epitaxial film because defects, etc. occurring at the interface between the ferroelectric thin film and the oxide thin film cause ferroelectric properties, etc. to become worse.

In this regard, known structures comprising another oxide thin film between a ferroelectric thin film and a metal thin film, for instance, include those mentioned below.

In Example 1, JP-A 11-274419 describes a thin-film capacitor comprising an Si (100) substrate and, in order from the substrate, $V_{1-x}Al_xN$, Pt, $SrRuO_3$, BSTO and Pt stacked thereon. The publication teaches that Pt underneath $SrRuO_3$ functions as an anti-oxidant layer alone, but says nothing about stress relaxation and stress control by a combination of Pt and $SrRuO_3$. The publication states that Pt is not necessarily used, and so is silent about its thickness. Further, the publication shows a structure with a nitride interposed between a lower electrode and the substrate. However, this structure is different from the structure according to the invention wherein a buffer layer comprising an oxide is interposed between the metal thin film and the substrate. Such a similar structure as mentioned above is also referred to in IEEE ELECTRON DEVICE LETTERS, Vol.18(1997), pp. 529–531. However, Pt underneath $SrRuO_3$ is introduced so as to prevent surface oxidation of the nitride layer underneath Pt, and has a thickness of 30 nm. The results of our review reveal that a 30 nm thick Pt thin film has no or little effect on stress relaxation. Thus, with such a structure it is impossible to obtain the effect contemplated herein.

JP-A 10-93036 discloses a dielectric thin film device comprising a lower electrode comprising an electrically conductive perovskite oxide and a dielectric thin film formed on the lower electrode and comprising a perovskite oxide, characterized in that a layer comprising at least one selected from a metal whose oxide has electrical conductivity and a nitride, silicide and oxide of said metal having electrical conductivity is provided as a layer underneath said lower electrode. However, the layer underneath the lower electrode, described in the publication, is provided to prevent such oxidation as to have adverse influences on the surface properties, electrical properties, etc. of the surface of a conductive layer present underneath the lower electrode, e.g., an Si or W plug; it is provided for the purpose different from that of the invention. In addition, the publication says nothing about a multilayer film formed of an epitaxial layer whatsoever. The multilayer film, because of being formed on polysilicon or $SiO_2$, cannot absolutely be an epitaxial layer, and so is greatly likely to be a polycrystalline or amorphous film. With such a film, it is impossible to obtain satisfactory ferroelectric properties or resonance properties.

JP-A 11-195768 discloses an electron device comprising an Si substrate and, in order from the substrate, $SiO_2$, Ti, Pt, SRO, PZT, SRO and Pt stacked thereon, but fails to refer to an epitaxial film. There is thus a great likelihood that this electron device is a polycrystalline or amorphous film, because of being formed on $SiO_2$. With such a film it is impossible to obtain satisfactory ferroelectric properties. In addition, the Pt film described in the publication is provided as a diffusion-preventing layer; it is provided for action different from that of the invention.

JP-A 11-322424 discloses a piezoelectric material comprising a laminate of a ferroelectric perovskite oxide and an electrically conductive perovskite oxide, and a structure wherein a metal electrode is stacked on the outside of the conductive perovskite oxide. However, this piezoelectric material cannot be an epitaxial mutilayer thin film formed on a substrate or Si or the like, because the publication states that the ferroelectric oxide is a sintered or single crystal material. Further, the publication does not give any account of why the conductive material is stacked on the metal electrode.

JP-A 06-224068 discloses a thin-film capacitor comprising a substrate and, in order from the substrate, an electrically conductive layer, a perovskite oxide dielectric material and an upper electrode stacked thereon, wherein the conductive layer has a multilayer structure comprising a first conductive layer formed of platinum and other high-melting metal and a second conductive layer comprising a metal oxide having a rhenium trioxide crystal structure. However, the first conductive layer is provided to prevent oxidation of the substrate; it is provided for action different from that of the invention. Titanium alone is referred to for the substrate. It is impossible to provide an epitaxial formation of ferroelectric material on such a substrate and, hence, obtain satisfactory ferroelectric properties.

Thus, multilayer thin films having another oxide thin film between a metal thin film and a ferroelectric thin film have so far been known in the art. However, they are different from the multilayer thin film of the invention in terms of film crystallographic properties and structure. In most of conventional multilayer thin films, the metal thin film is provided to prevent diffusion or oxidation. Never until now is there reported a multilayer thin film wherein stresses from the substrate are relaxed and controlled by a combined oxide thin film and metal thin film, as contemplated herein.

Ferroelectric Thin Film

The ferroelectric thin film is provided on the perovskite oxide thin film. Depending on the functions demanded such as ferroelectric properties and piezoelectric properties, an appropriate selection may be made from suitable materials. However, it is preferable to use the following materials.

(A) Perovskite materials such as Pb-base perovskite compounds, e.g., lead titanate containing rare earth elements, PZT (lead zirconate-titanate) and PLZT (lanthanum doped lead zirconate-titanate), and Bi-base perovskite compounds, which may be used in simple, composite or laminar forms.

Throughout the present disclosure, the ratio x for O in $ABO_x$ such as $PbTiO_3$ is consistently described as 3; however, x is not limited to 3. Some perovskite materials exist in the form of a stable perovskite structure with oxygen deficiencies or in excess of oxygen. Accordingly, the value of x in $ABO_x$ is usually of the order of 2.7 to 3.3. Further, A/B is not limited to 1. By varying A/B, it is possible to alter electrical properties such as ferroelectric and piezoelectric properties, surface flatness, and crystallographic properties. It is thus acceptable to vary A/B depending on the properties necessary for the ferroelectric thin film. Usually, A/B is of the order of 0.8 to 1.3. In this regard, A/B may be found by X-ray fluorescence analysis.

The aforesaid PZT is a solid solution based on $PbZrO_3$—$PbTiO_3$. The aforesaid PLZT is a compound wherein PZT is doped with La which, according to $ABO_3$ notation, is typically represented just as (Pb: 0.89~0.91, La: 0.11~0.09)(Zr: 0.65, Ti: 0.35)$O_3$.

Of the perovskite ferroelectric materials, PZT is preferred because of being improved in not only ferroelectric properties but piezoelectric properties as well. A PZT thin film should have a composition wherein the Ti/(Ti+Zr) atomic ratio is in the range of preferably 0.60 to 0.90, and more preferably 0.70 to 0.85. In a composition region wherein the proportion of Ti is less than 0.60, the ferroelectric properties or resonance properties become worse. On the other hand, when the proportion of Ti is too high, insulating properties become worse.

For the rare earth element-containing lead titanate, it is preferable to use compositions wherein the atomic ratio is (Pb+R)/Ti=0.8 to 1.3 and Pb/(Pb+R)=0.5 to 0.99, and especially (Pb+R)/Ti=0.9 to 1.2 and Pb/(Pb+R)=0.7 to 0.97. The rare earth element-containing lead titanate having such compositions is disclosed in JP-A 10-17394.

(B) Tungsten bronze materials such as tungsten bronze oxides, e.g., SBN (strontium-barium niobate) and PBN (lead-barium niobate).

For the tungsten bronze materials, preference is given to those described in A Collection of Ferroelectric Materials, Landoit-Borenstein. Vol. 16. To be more specific, preference is given to (Ba, Sr)$Nb_2O_6$, (Ba, Pb)$Nb_2O_6$, $PbNb_2O_6$, $PbTa_2O_6$, $BaTa_2O_6$, $PbNb_4O_{11}$, $PbNb_2O_6$, $SrNb_2O_6$, $BaNb_2O_6$, etc., or their solid solutions. In particular, SBN [(Ba, Sr)$Nb_2O_6$] and PBN[(Ba, Pb)$Nb_2O_6$] are preferred.

The ferroelectric thin film must have grown epitaxially on the underlying perovskite oxide thin film. The ferroelectric thin film, when it is a tetragonal crystal system, should preferably be a (001) uniaxially oriented film. However, this ferroelectric thin film may have a 90° domain structure comprising (100) oriented crystals and (001) oriented crystals under the influence of stresses from the Si substrate.

Crystallographic Properties

The crystallographic properties of the buffer layer, metal thin film, oxide thin film and ferroelectric thin film may be estimated in terms of the half-widths of rocking curves for reflection peaks in XRD (X-ray diffraction), and the patterns of RHEED images. It is here noted that RHEED is an abbreviation of reflection high energy electron diffraction.

More specifically, each of the layer and thin films according to the invention should preferably possess crystallographic properties enough to reduce the half-width of a reflection rocking curve for the (100) plane or (001) plane down to 1.50° or less. Although there is no particular lower limit to the half-width of a rocking curve, yet the half-width should preferably be reduced as much as possible. At present, the aforesaid lower limit is generally about 0.7°, esp., about 0.4°. A RHEED image of a certain sample, when viewed in a spot form, indicates that the sample has surface asperities. A RHEED image of a certain sample, when viewed in a streak form, shows that the sample has a flat surface. In either case, a sharp RHEED image indicates that the sample has improved crystallographic properties.

In the multilayer thin film of the invention, all the buffer layer, metal thin film, oxide thin film and ferroelectric thin film are epitaxially grown films.

Substrate

The substrate used herein may be selected from various single crystals such as Si, MgO and $SrTiO_3$. However, the most preference is given to a substrate having an Si (100) single crystal surface. When the Si single crystal substrate is used, it is preferable that axes present in the planes of the substrate and multilayer thin film are parallel with one another.

Fabrication Process

No particular limitation is placed on how to fabricate the buffer layer, metal thin film, oxide thin film and ferroelectric thin film, and so an appropriate selection may be made from processes capable of allowing epitaxial growth of them on the substrate, esp., the Si single crystal substrate. However, it is preferable to make use of evaporation, MBE and RF magnetron sputtering processes, and it is particularly preferable to make use of the evaporation processes set forth in the aforesaid JP-A 09-110592, and JP-A 10-287494 published under the name of the applicant, etc.

For a specific fabrication process of the invention, how to form a multilayer thin film using a buffer layer comprising a zirconia thin film and a $Y_2O_3$ thin film, a metal thin film comprising a Pt thin film, an oxide thin film comprising $SrRuO_3$ and a ferroelectric thin film comprising PZT is now explained.

To carry out this fabrication process, it is desired to make use of an evaporation system 1 having such construction as shown in FIG. 1 as an example.

This evaporation system 1 is built up of a vacuum chamber 1a provided with a vacuum pump P, in which chamber 1a a holder 3 for holding a substrate 2 on its lower side is provided. This holder 3 is connected to a rotating means 5 such as a motor via a rotary shaft 4, so that it can be rotated by this rotating means 5 to rotate the substrate 2 within its plane. The holder 3 also includes a built-in heating means 6 such as a heater for heating the substrate 2.

The evaporation system 1 includes an oxidizing gas feed unit 7 having an oxidizing gas inlet 8 positioned just beneath the holder 3, whereby the partial pressure of the oxidizing gas can be elevated in the vicinity of the substrate 2. At positions below and further away from the holder 3, there are located a first evaporation unit 9 for feeding Zr or the like, a second evaporation unit 10 for feeding $TiO_x$ (x=1.67) or the like and a third evaporation unit 11 for feeding PbO or the like. At each evaporation unit, an energy feeder (an electron beam generator, a resistive heater or the like) for supplying energy for evaporation is located together with its own evaporation source.

First of all, the substrate is set at the aforesaid holder. With this fabrication process, it is possible to form homogeneous thin films on a substrate having a large area of typically 10 $cm^2$ or larger. This enables an electron device comprising the multilayer thin film of the invention to be fabricated at much lower costs than could be achieved so far in the art. It is here noted that the upper limit to the area of the substrate is about 400 $cm^2$ at the bast under the current circumstances, although there is no particular limitation thereon. It is also possible to form the multilayer thin film on a selected region of a wafer using a mask or the like, not all over the surface of the wafer.

Prior to the formation of the buffer layer, it is preferable to subject the Si substrate to surface treatment. For this surface treatment, it is preferable to make use of treating processes as typically disclosed in the aforesaid JP-A 09-110592 or JP-A 10-287494.

After such surface treatment, the Si crystals on the substrate surface are covered and protected by an Si oxide layer. This Si oxide layer is reduced and removed by a metal such as Zr fed onto the substrate surface for the formation of the buffer layer.

Then, the buffer layer is formed, followed by the formation of the metal thin film thereon. The formation of the buffer layer and metal thin film should preferably be carried out using fabrication process as typically set forth in JP-A's 11-312801 and 9-110592.

Subsequently, the oxide thin film is formed on the obtained metal thin film. Reference is here made to the case where an $SrRuO_3$ thin film is formed as the oxide thin film. Preferably, this thin film is formed by feeding Sr and Ru from their respective evaporation sources while introducing the oxidizing gas into the vacuum chamber in the evaporation system 1. In the meantime, the vacuum chamber is continuously evacuated by the vacuum pump.

For the oxidizing gas, oxygen, ozone, atomic oxygen, $NO_2$, radical oxygen, etc. may be used. However, it is preferable to use oxygen. The oxidizing gas is continuously supplied into the continuously evacuated vacuum chamber. At this time, the oxidizing gas should preferably be fed from the vicinity of the substrate. This makes it possible to locally create a region having a high partial pressure of oxygen in the vicinity of the substrate, so that the reaction involved can be accelerated in a small amount of the gas fed. The amount of the oxygen gas fed is in the range of preferably 5 to 50 cc/min., and more preferably 15 to 35 cc/min. Since the optimum value of the amount of the oxygen gas fed varies depending on the volume of the vacuum chamber, the evacuation speed of the vacuum pump, the distance from the gas inlet to the substrate, etc., it is preferable to predetermine a suitable amount of the gas to be fed.

Each evaporation source is heated and evaporated by electron beams, resistive heating or the like for feeding to the substrate. The film deposition rate is in the range of preferably 0.02 to 1.00 nm/s, and more preferably 0.05 to 0.30 nm/s. At too low a film deposition rate, the controllability of the gas amount fed from each evaporation source becomes worse and so the resultant film tends to become inhomogeneous. At too high a film deposition rate, on the other hand, the crystallographic properties of each film becomes worse.

The substrate temperature for the formation of $SrRuO_3$ is in the range of preferably 550 to 850° C., and more preferably 650 to 750° C. At too low a substrate temperature, no epitaxial film of satisfactory crystallographic properties is obtainable. At too high a substrate temperature, on the other hand, the surface properties of the oxide thin film become worse or the underlying metal thin film reacts with the substrate. This in turn renders the epitaxial growth of the oxide thin film unfeasible.

While the process for the formation of $SrRuO_3$ has been explained, it is appreciated that the same process may also be applied to the epitaxial growth of other oxide thin film.

Then, the ferroelectric thin film is formed. When PZT is formed as the ferroelectric thin film, it is preferable to form PZT by feeding PbO, $TiO_x$ (x=1.67) and Zr from their respective evaporation sources with the introduction of the oxidizing gas. For the oxidizing gas, oxygen, ozone, atomic oxygen, $NO_2$, radical oxygen or the like may be used. However, it is preferable to use radicalized oxygen for a partial or substantial portion of the oxidizing gas. This makes it possible to inhibit the re-evaporation of Pb or PbO during the formation of the PZT thin film. The reason for using PbO for the lead evaporation source is that PbO is less susceptible to re-evaporation on a high temperature substrate, and higher in the rate of deposition, than Pb. The reason for using $TiO_x$ for the titanium evaporation source is again that the rate of deposition becomes high. It is not preferable to use Ti in place of $TiO_x$ because PbO is deprived of oxygen by Ti, yielding Pb susceptible to re-evaporation. The range of x in $TiO_x$ should be preferably $1 \leq x < 1.9$, more preferably $1 \leq x < 1.8$, even more preferably $1.5 \leq x \leq 1.75$, and most preferably $1.66 \leq x \leq 1.75$. Such $TiO_x$ melts in the vacuum chamber with the application of thermal energy thereto, ensuring a stable rate of evaporation.

The substrate temperature for PZT formation should be in the range of preferably 500 to 750° C., and more preferably 550 to 650° C., and the deposition rate should be in the range of preferably 0.030 to 1.000 nm/s, and more preferably 0.100 to 0.300 nm/s. At too slow a deposition rate, difficulty is involved in keeping the deposition rate constant, and so the film tends to become inhomogeneous. At too high a deposition rate, on the other hand, the crystallographic properties of the film becomes worse.

$TiO_x$ and Zr should preferably be fed onto the substrate at the rate of evaporation corresponding to the end composition ratio, because nearly the entire amount of $TiO_x$ and Zr fed is incorporated in the growing PZT crystals. However, composition control of PbO is difficult because PbO is susceptible to composition variations due to its high vapor pressure. In the present formation process that rather makes use of this nature of PbO, the amount of PbO fed from the PbO evaporation source onto the substrate should be in excess of the amount of the PZT film crystals to be formed. Regarding to what degree PbO is fed in excess, here let $E[Pb/(Ti+Zr)]$ represent the atomic ratio of Pb and (Ti+Zr) fed from the evaporation sources, i.e., Pb/(Ti+Zr) and $F[Pb/(Ti+Zr)]$ represent the atomic ratio of Pb and (Ti+Zr) in the formed ferroelectric thin film, i.e., Pb/(Ti+Zr). Then, these relations must be $E[Pb/(Ti+Zr)]/F[Pb/(Ti+Zr)]=1.5$ to 3.5, preferably $E[Pb/(Ti+Zr)]/F[Pb/(Ti+Zr)]=1.7$ to 2.5, and more preferably $E[Pb/(Ti+Zr)]/F[Pb/(Ti+Zr)]=1.9$ to 2.3. An excessive portion of PbO or a portion of PbO that is not incorporated in the perovskite structure is re-evaporated on the surface of the substrate, so that only the PZT film of the perovskite structure is grown on the substrate. When $E[Pb/(Ti+Zr)]/F[Pb/(Ti+Zr)]$ is too small, it is difficult to feed a sufficient amount of Pb into the film, and so the film does not take any perovskite structure of high crystallographic properties because the Pb/(Ti+Zr) ratio in the film becomes too low. When $E[Pb/(Ti+Zr)]/F[Pb/(Ti+Zr)]$ is too large, on the other hand, the Pb/(Ti+Zr) ratio in the film becomes too high to obtain any perovskite single-phase structure because other Pb-enriched phases occur in addition to the perovskite phase.

As explained above, PbO and $TiO_x$ are used as the evaporation sources to enhance the rate of deposition, radical oxygen is used for strong oxidization, and the substrate temperature is set in the given range, so that substantially stoichiometric PZT crystals containing Pb reasonably can be grown on the substrate in a self-alignment manner. This process makes a breakthrough in the fabrication of stoichiometric lead base perovskite crystal thin films and, hence, ferroelectric thin films of extremely high crystallographic properties.

This process may be applicable, with the same effects, to the formation of thin films comprising other Pb-base ferroelectric materials, and to the formation of Bi-base oxide thin films as well. In conventional Bi-base oxide thin films, too, composition control has so far been less than satisfactory because of high Bi vapor pressure in a vacuum. In this regard, it has been shown that the Bi-base oxide thin films can be formed by this process using $Bi_2O_3$ evaporation sources instead of PbO evaporation sources. In the Bi-base oxide thin films, too, it is possible to obtain stoichiometric ferroelectric thin-film crystals with Bi incorporated therein reasonably and in a self-alignment manner.

When another oxide thin film is formed on the thus prepared ferroelectric thin film, it is preferable to use the same oxide thin film fabrication process as mentioned above. With this process, it is possible to achieve the stable epitaxial growth of the oxide thin film on the ferroelectric thin film. The substrate temperature should preferably be substantially equal to the substrate temperature for the formation of the ferroelectric thin film. This in turn enables the compressive stresses of the oxide thin film to act effectively on the ferroelectric thin film.

When the thin film is formed on an area of about 10 cm² or greater, for instance, on the surface of a substrate of 2 inches in diameter, the substrate is rotated as shown in FIG. 1 to feed the oxidizing gas uniformly all over the surface of the substrate, thereby accelerating the oxidization reaction all over the surface of the substrate. It is thus possible to form a homogeneous film having a large area. In this case, the substrate should be rotated at 10 rpm or greater. A low rpm makes the distribution of film thickness likely to occur within the plane of the substrate. Although there is no particular upper limit to the rpm of the substrate, the upper limit should usually be about 120 rpm in consideration of the mechanism of the vacuum system used.

The process for the fabrication of the multilayer thin film according to the invention has been described in details. As can be clearly understood from comparisons with conventional vacuum evaporation, sputtering, and laser abrasion processes, this process can be carried out under easy-to-control operating conditions where there is no risk of inclusion of impurities whatsoever, and so lends itself well to obtaining the end product of high integrity with high reproducibility yet with a large area.

In addition, even when this process is used with an MBE system, it is possible to obtain the end product much in the same manner as mentioned above.

Electron Device

After processed by semiconductor processes, the multilayer thin film of the invention may be applied to semiconductor memories constructed as capacitors and FET gates, thin-film ferroelectric devices such as infrared sensors, recording media for recording information by polarization reversal of ferroelectrics by AFT (atomic force microscope) probes or the like, thin-film vibrators such as FBARS, thin-film VCOs and thin-film filters used for mobile communications equipment, thin-film piezoelectric devices used for liquid injectors, and so on. Processing by semiconductor processes may be carried out either after or in the process of the formation of multilayer thin films. For instance, the buffer layer and metal thin film are first formed. Then, the metal thin film is patterned by etching or the like to leave a metal thin film portion and a buffer thin film portion exposed on the substrate. Subsequently, the oxide thin film and ferroelectric thin film are formed on that substrate. It is acceptable to obtain an electron device in this way. In this case, the oxide thin film and ferroelectric thin film formed on the metal thin film are epitaxially grown in the cube-on-cube relation to the crystals of the metal thin film. However, the oxide thin film and ferroelectric thin film formed on a portion of the substrate with the metal thin film removed therefrom are often eptiaxially grown while they are turned at an angle of 45° in the plane with respect to the thin films formed on the metal thin film.

EXAMPLE

In what follows, the present invention is now explained in more details with reference the following some specific examples.

Example 1 & Comparative Examples 1, 2

A multilayer thin film comprising an Si (100) single crystal substrate and, in order from the substrate, a $ZrO_2$ thin film, a $Y_2O_3$ thin film, a Pt thin film, a $BaTiO_3$ thin film, an $SrRuO_3$ thin film and a PZT thin film stacked thereon was prepared in the following procedure.

First of all, an Si single crystal wafer (in a cylindrical form of 2 inches in diameter and 250 μm in thickness) cut with a surface defined by the (100) plane, followed by mirror polishing, was provided. This wafer was then washed on the surface with etching, using a 40% aqueous solution of ammonium fluoride.

Subsequently, the single crystal substrate 2 was fixed to the substrate holder 3 having rotating and heating mechanisms and housed in the vacuum chamber 1a in the evaporation system 1 shown in FIG. 1. After the vacuum chamber was evacuated to $10^{-6}$ Torr by means of an oil diffusion pump, the substrate was rotated at 20 rpm and heated to 600° C. while oxygen was introduced in the vicinity of the substrate at a rate of 25 cc/min. through the nozzle 8 for the purpose of protecting the washed surface of the substrate with an Si oxide. Consequently, the surface of the substrate was thermally oxidized to form an about 1 nm thick Si oxide film on the surface of the substrate.

Figure 2:
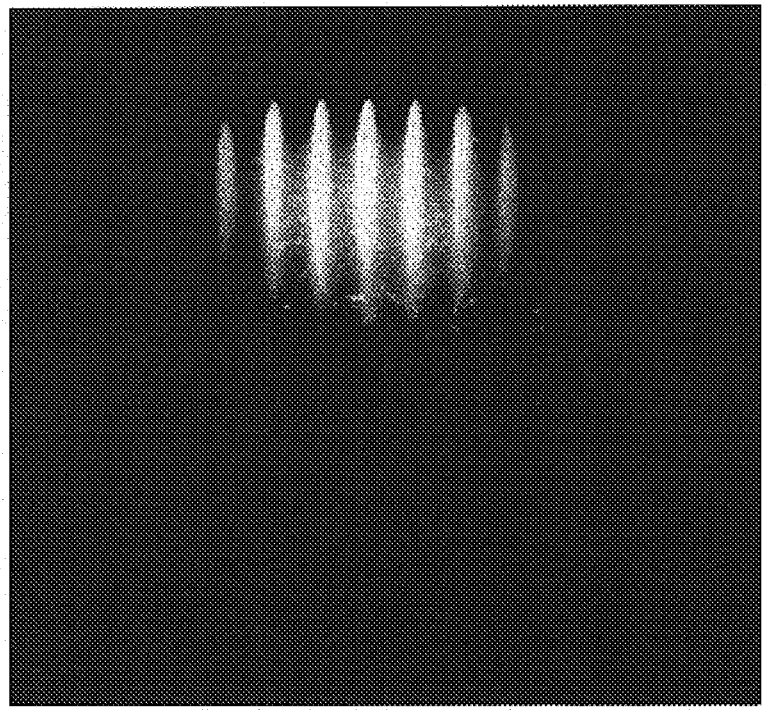
FIG. 2 is a drawing substitute photograph illustrative of a crystal structure, wherein an RHEED image of a $ZrO_2$ thin formed on an Si single crystal substrate is shown.

Next, the substrate was heated to 900° C. and rotated at 20 rpm. At this time, an oxygen gas was introduced at a rate of 25 cc/min. from the nozzle and metallic Zr was evaporated from the associated evaporation source to feed it onto the surface of the substrate for the reduction of the Si oxide formed at the previous step and the formation of a thin film. In this regard, the amount of metallic Zr fed was 10 nm as calculated on a $ZrO_2$ film thickness basis. The fact that this thin film was a (001) uniaxially oriented $ZrO_2$ thin film of high crystallographic properties was shown by the presence of a distinct (002) peak for $ZrO_2$ in X-ray diffraction. As shown in FIG. 2, the $ZrO_2$ thin film exhibits a RHEED image having a perfect streak pattern, indicating that this thin film has a flat surface on a molecular level and is an epitaxial film of high crystallographic properties.

Figure 3:
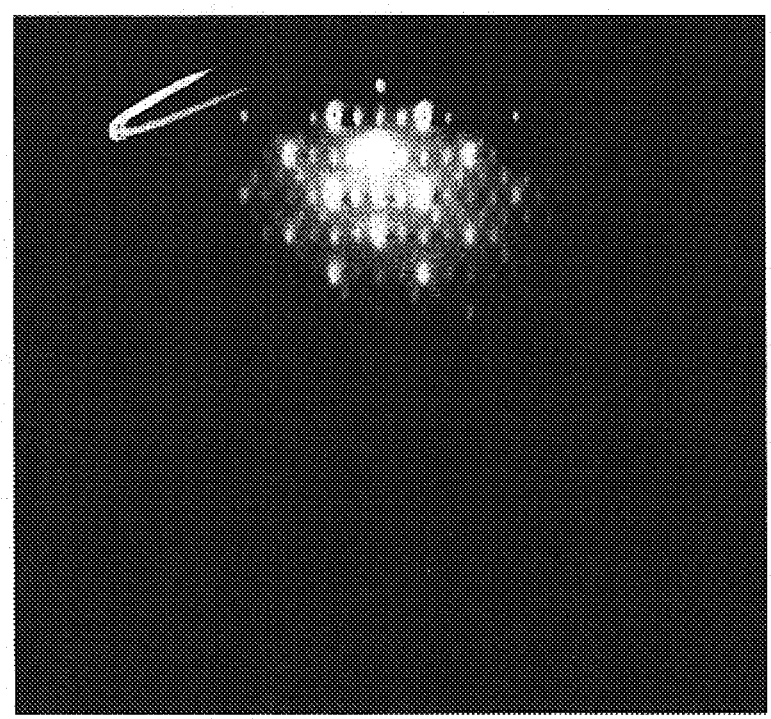
FIG. 3 is a drawing substitute photograph illustrative of a crystal structure, which shows an RHEED image of a $Y_2O_3$ thin film formed on the $ZrO_2$ thin film whose RHEED image is shown in FIG. 2.

Next, the single crystal substrate with the $ZrO_2$ thin film formed thereon was used as a fresh substrate. Metallic Y was fed onto the surface of the substrate under the conditions of a substrate temperature of 900° C., a substrate rpm of 20 and an oxygen gas feed rate of 15 cc/min., thereby forming a $Y_2O_3$ thin film thereon. The amount of metallic Y fed was 40 nm as calculated on a $Y_2O_3$ basis. As shown in FIG. 3, the RHEED image of this $Y_2O_3$ thin film exhibits sharp spots, indicating that the $Y_2O_3$ thin film is an epitaxial film of improved crystallographic properties, with surface asperities. Observation of a section of the $Y_2O_3$ thin film under a transmission electron microscope indicates the presence of 10 nm high facet planes at a ratio of 95% or higher.

Figure 4:
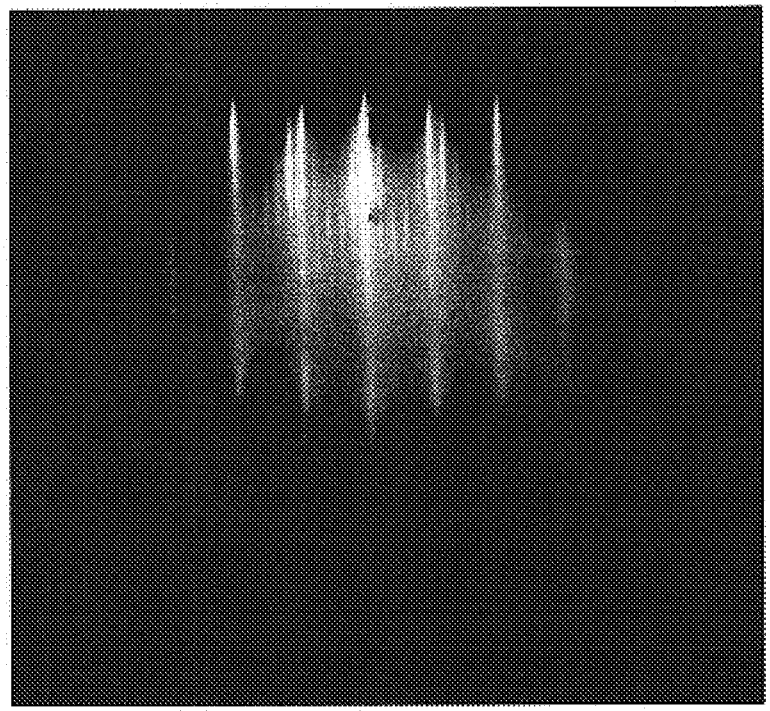
FIG. 4 is a drawing substitute photograph illustrative of a crystal structure, which shows an RHEED image of a Pt thin film formed on the $Y_2O_3$ thin film whose RHEED image is shown in FIG. 3.

Next, a 100 nm thick Pt thin film was formed as the metal thin film on the $Y_2O_3$ thin film. The substrate temperature was 700° C. and the substrate rpm was 20. This Pt thin film exhibits a RHEED image having a sharp streak pattern as shown FIG. 4, indicating that the Pt thin film is an epitaxial film of improved crystallographic properties, with a flat surface on a molecular level.

As measured according to JIS B0610, the surface of the Pt thin film was found to have a ten-point average roughness Rz (at a reference length of 1,000 nm) of 1.1 to 1.8 nm, that is, direct evidence for improved flatness.

Figure 5:
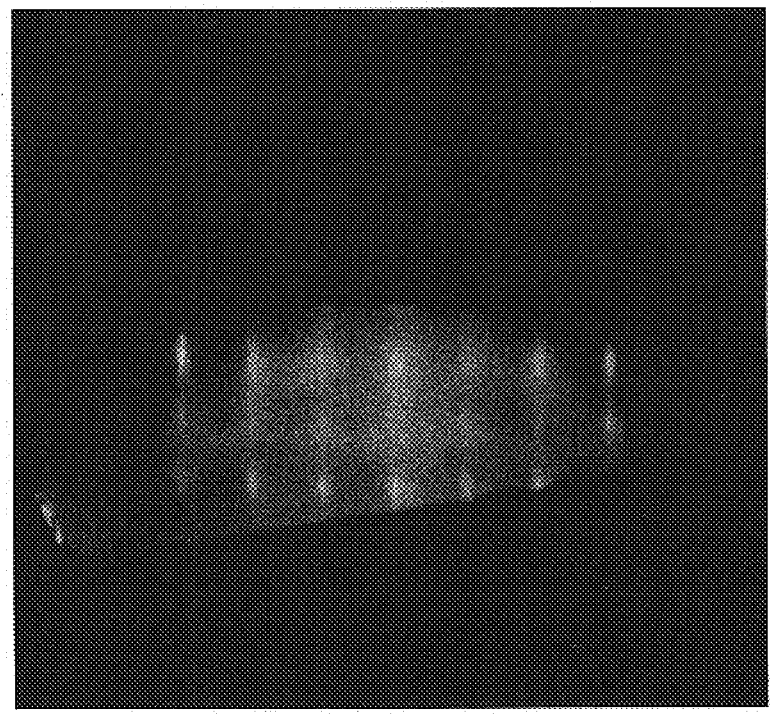
FIG. 5 is a drawing substitute photograph illustrative of a crystal structure, which shows an RHEED image of an $SrRuO_3$ thin film formed on the Pt thin film whose RHEED image is shown in FIG. 4, with a $BaTiO_3$ thin film interposed between them.

Next, a 50 nm thick $SrRuO_3$ thin film was formed as the oxide thin film on the Pt thin film with a 5 nm thick $BaTiO_3$ tin film interposed therebetween. The substrate was set at a temperature of 750° C. and 20 rpm, and the oxygen gas was fed at a feed rate of 25 cc/min. Sr and Ru were evaporated on the substrate from the respective evaporation sources. The thus formed $SrRuO_3$ thin film exhibits a RHEED image having a sharp streak pattern as shown in FIG. 5, indicating that the thin film is an epitaxially grown film of high crystallographic properties, with a flat surface on a molecular level. The $SrRuO_3$ thin film had also a specific resistance of $4\times10^{-4}$ Ωcm.

Next, a 500 nm thick PZT film was formed as the ferroelectric thin film on the $SrRuO_3$ thin film, using an evaporation process. More specifically, the substrate was heated to 600° C. and rotated at 20 rpm. Then, a radical oxygen gas was introduced from an ECR oxygen source at a rate of 10 cc/min., and PbO, $TiO_x$ (x=1.67) and Zr were fed onto the substrate from the respective evaporation sources, so that the PZT film was formed thereon. The amounts of the materials fed from their evaporation sources were controlled in such a way that the molar ratio for $PbO:ZrO_2:TiO_2$ was 2:0.25:0.75.

X-ray fluorescence spectrometry of the composition (in atomic ratio) of the PZT film gave Pb/(Ti+Zr)=1.00

Zr/Ti=0.330

A PZT bulk material having this composition has a lattice constant of 0.4018 nm at 600° C. whereas the $SrRuO_3$ film underneath the PZT film has a lattice constant of 0.3966 nm at 600° C. Thus, the multilayer thin film of this example is equivalent to the case wherein the a-axis lattice constant of the material used for the cubic oxide thin film is smaller than the a-axis lattice constant of the material used for the ferroelectric thin film.

Figure 6:
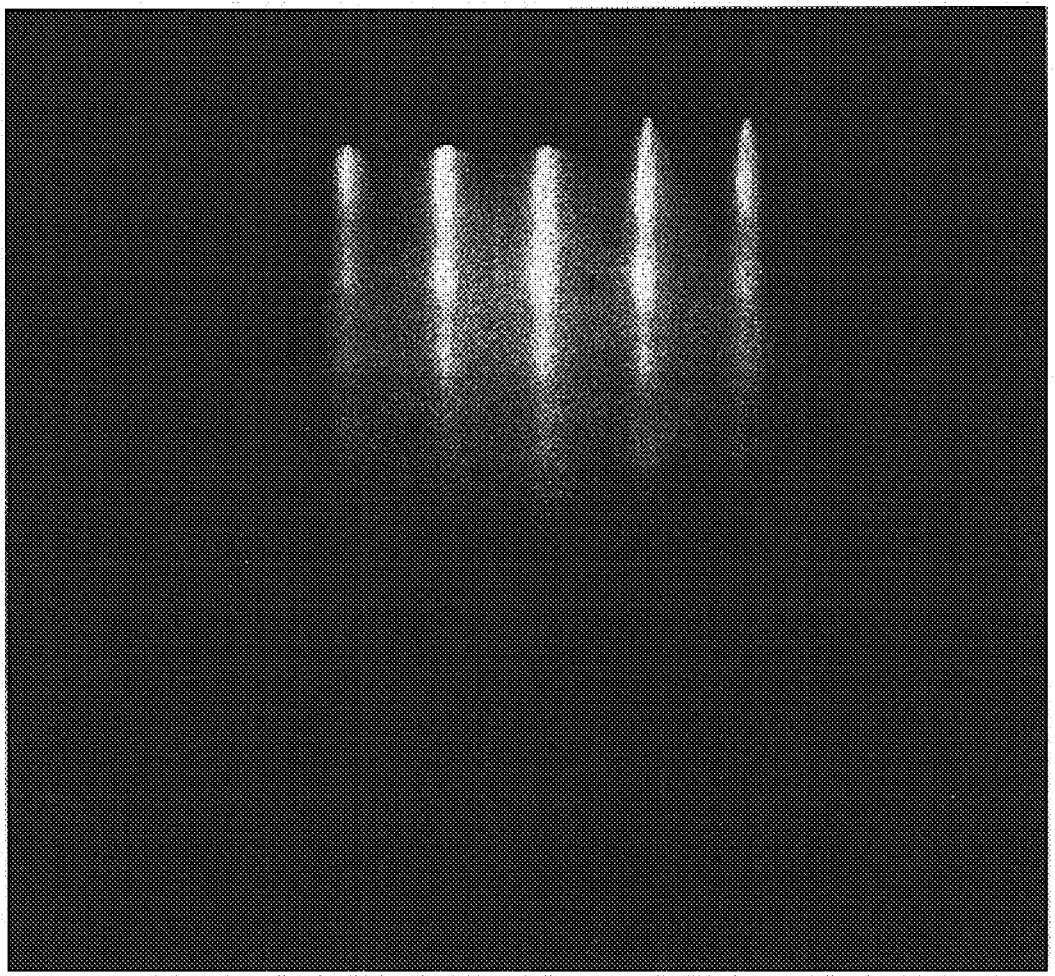
FIG. 6 is a drawing substitute photograph illustrative of a crystal structure, which shows an RHEED image of a PZT thin film formed on the $SrRuO_3$ thin film whose RHEED image is shown in FIG. 5.

The thus formed PZT film exhibited a sharp streak pattern as shown in FIG. 6. As a result of measurement of X-ray diffraction of the multilayer thin film having a $PZT/SrRuO_3/Pt/Y_2O_3/ZrO_2/Si$ (100) structure, only peaks equivalent to (001) or (100) were observed. From these, it was found that this multilayer thin film is an epitaxially grown film of high crystallographic properties, with the in-plane crystal axes having PZT [100]//Si [010] or PZT [001]//Si [010] relations.

On the other hand, a multilayer thin film having a $PZT/Pt/Y_2O_3/ZrO_2/Si$ (100) structure is here referred to as Comparative Example 1. This comparative structure provides a multilayer thin film according to Example 1, from which the layer of the oxide thin film, i.e., the $SrRuO_3$ thin-film layer has been removed. Each layer was formed with the same thickness and composition as in Example 1, using the same process as in Example 1. The RHEED image of each layer exhibited a similar streak or spot pattern as in Example 1, indicating that each layer was an epitaxially grown film of high crystallographic properties.

A multilayer thin film having a $PZT/SrRuO_3/BaTiO_3/ZrO_2/Si$ (100) structure is also referred to as Comparative Example 2. This structure had no metal thin film between the oxide thin film and the Si substrate. The PZT thin film was formed with the same composition and thickness as in Example 1, using the same process as in Example 1. Both the $SrRuO_3$ thin film and the $BaTiO_3$ thin film had a thickness of 50 nm. From the RHEED pattern of each layer, it was found to have had grown epitaxially.

Figure 7:
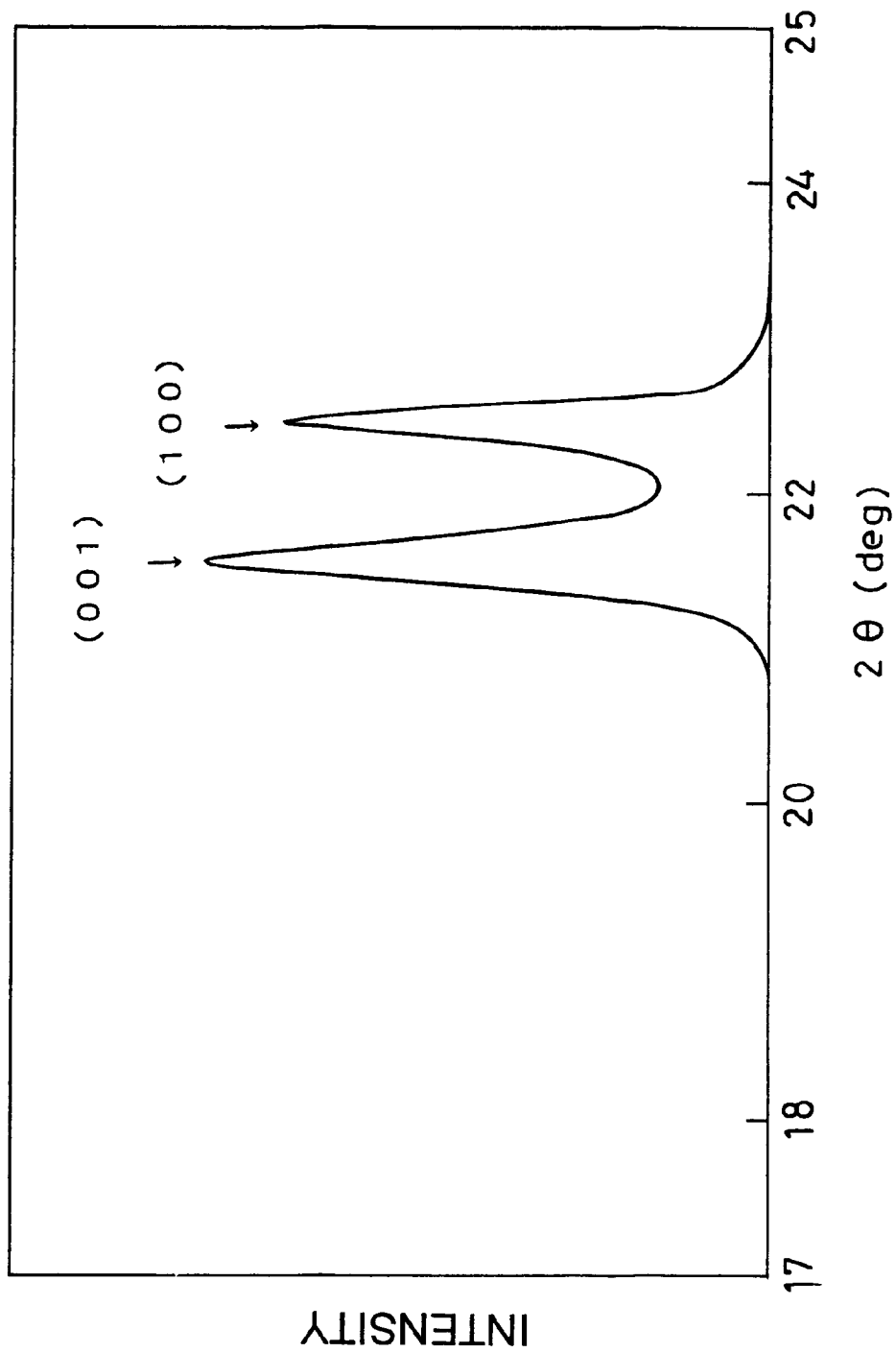
FIG. 7 is an X-ray diffraction chart for the PZT film formed on $SrRuO_3/Pt/Y_2O_3/ZrO_2/Si$ (100).
Figure 8:
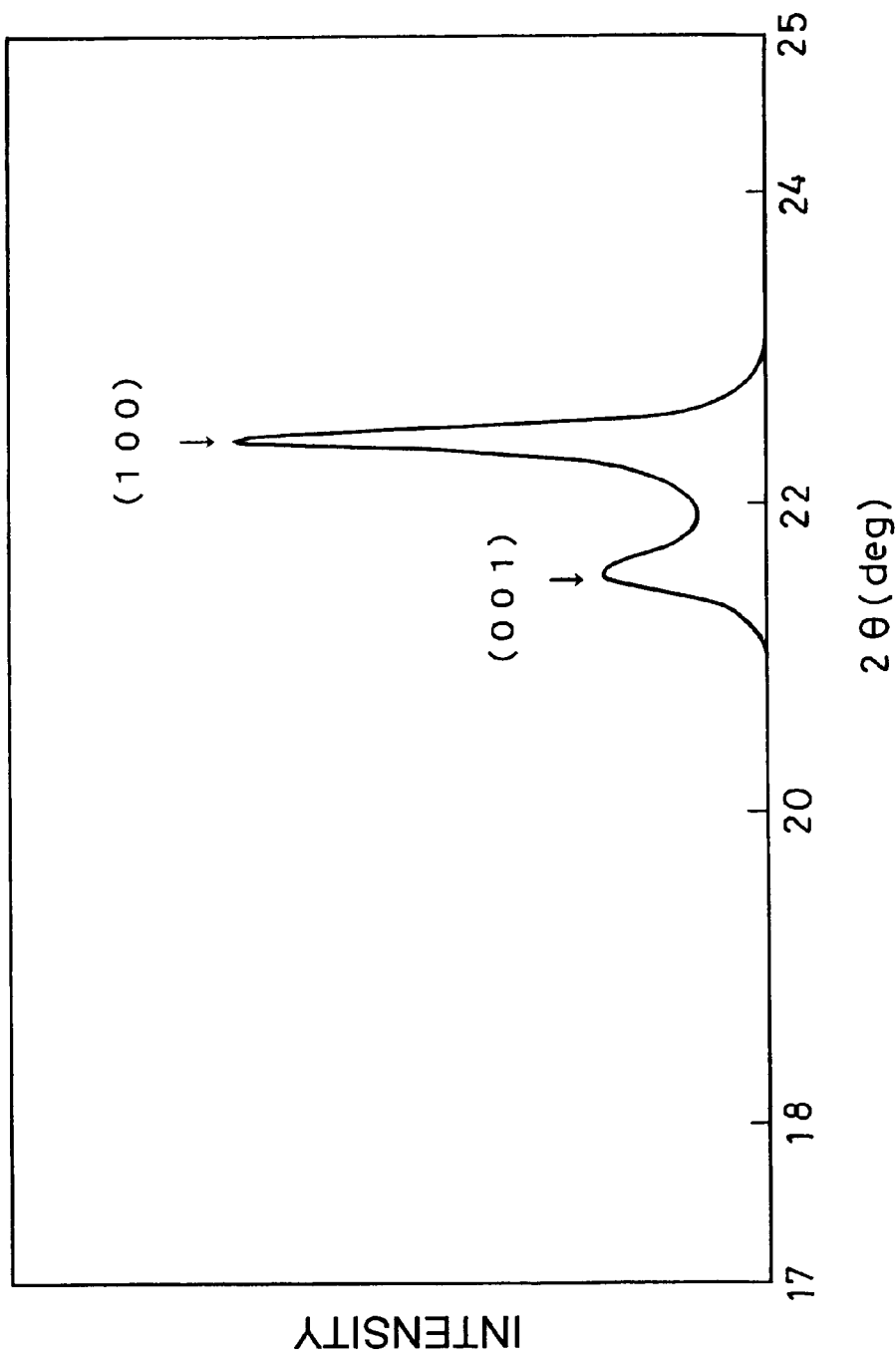
FIG. 8 is an X-ray diffraction chart for the PZT film formed on $Pt/Y_2O_3/ZrO_2/Si$ (100).
Figure 9:
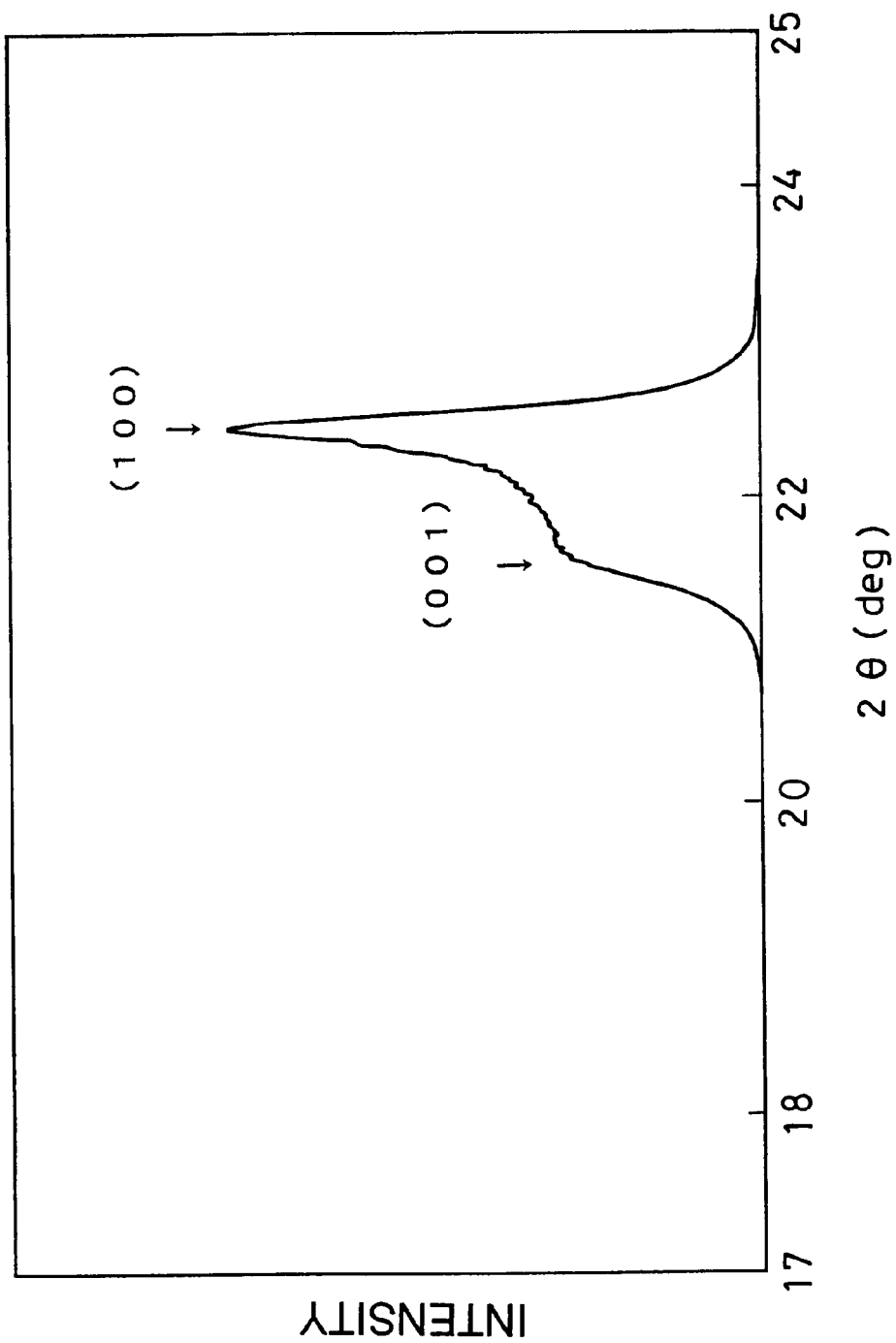
FIG. 9 is an X-ray diffraction chart for the PZT film formed on $SrRuO_3/BaTiO_3/ZrO_2/Si$ (100).

The results of X-ray diffraction of the PZT films in Example 1 and Comparative Examples 1 and 2 in the vicinity of the (001) and (100) peaks are shown in FIGS. 7, 8 and 9, respectively. The diffraction of the $SrRuO_3$ film, and BaTiO$_3$ film underneath the PZT film was superposed on these peaks; however, it was previously found from the X-ray diffractometry of the underlying layer alone that the influence of diffraction from the underlying layer on the (001) or (100) peak of the PZT thin film could substantially be neglected. To determine the proportion of the (001) domains and the (100) domains in each PZT film, Ic/(Ia+Ic) for each PZT film was found provided that Ic was the (001) peak intensity and Ia was the (100) peak intensity. The value of Ic/(Ia+Ic) was 0.540 for the PZT/SrRuO$_3$/Pt/Y$_2$O$_3$/ZrO$_2$/Si (100) structure, 0.158 for the PZT/Pt/Y$_2$O$_3$/ZrO$_2$/Si (100) structure, and 0.267 for the PZT/SrRuO$_3$/BaTiO$_3$/ZrO$_2$/Si (100) structure, respectively. From these, it was shown that given the structure of Example 1, it is then possible to obtain a PZT film with a domain structure remarkably improved so that the (001) orientation can be achieved preferentially.

Example 2 & Comparative Example 3

Figure 10:
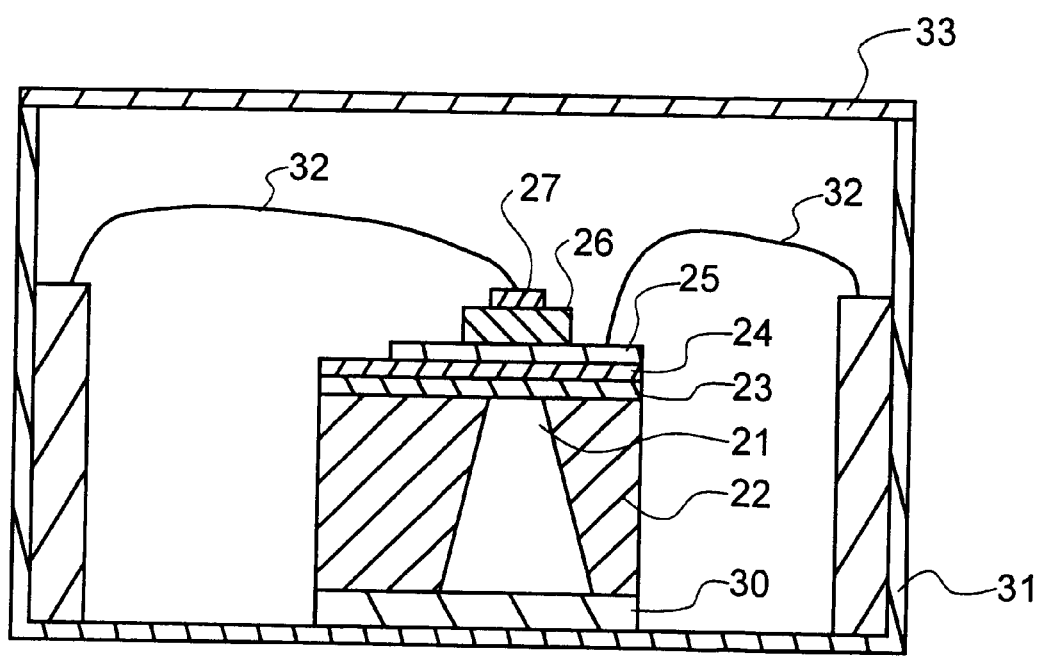
FIG. 10 is a structural representation of an FBAR device fabricated using the multilayer thin film of the invention.

An FBAR device having the structure shown in FIG. 10 was prepared, using the multilayer thin film of Example 1.

The FBAR device shown in FIG. 10 comprises an Si (100) single crystal substrate 22 having a via hole 21 (hereinafter called simply the Si substrate) and, in order from the Si substrate 22, a buffer layer 23 comprising an oxide thin film or the like, a lower electrode 24 comprising an electrically conductive thin film of Pt or the like, a perovskite oxide thin film 25 of BaTiO$_3$, SrRuO$_3$, etc., a ferroelectric thin film 26 of PZT or the like, and an upper electrode 27 comprising an electrically conductive thin film of Au or the like. The via hole 21 is formed by anisotropic etching of Si from the lower side shown in FIG. 10, and allows the thin films stacked thereon to set up a diaphragm structure. The lower side of the Si substrate 22 is bonded to the bottom of a package 31 by means of a die bonding agent 30, and the upper portion of the package 31 is tightly lidded at 33.

First of all, the buffer layer 23 of ZrO$_2$, and Y$_2$O$_3$, the lower electrode 24 of Pt and the oxide thin film 25 of BaTiO$_3$, and SrRuO$_3$ were formed on the Si (100) substrate 22 in this order. Then, the SrRuO$_3$/BaTiO$_3$/Pt layer was partially etched away to subject the lower electrode to patterning, and the PZT ferroelectric layer 26 was formed thereon by evaporation. Here the lower electrode has an area of 20 μm×20 μm square. At this time, a part of the PZT film was formed on Y$_2$O$_3$. However, it has been shown by RHEED that the PZT film has grown epitaxially on both SrRuO$_3$ and Y$_2$O$_3$. The PZT thin film had a composition of a Zr:Ti atomic ratio of 0.25:0.75 and a thickness of 500 nm. Subsequently, the Al upper electrode 27 having an electrode area of 20 μm×20 μm square was formed and patterned, and the via hole 21 was formed by etching the Si substrate 22. Finally, the multilayer thin film was divided into chips by a dicing device. Each chip was mounted in the package 31 using the die bonding agent 30, and a wire 32 was used for interconnection. The package was sealed to obtain a complete device.

In Comparative Example 3, an FBAR device was prepared, using the multilayer thin film having the PZT/Pt/Y$_2$O$_3$/ZrO$_2$/Si (100) structure. The multilayer thin film, and the device were formed as in Comparative Example 1, and Example 3, respectively.

The FBAR device of Example 3 was first measured with no application of direct voltage to the PZT film. The resonant and anti-resonant frequencies were 2.2 GHz and 2.49 GHz, respectively. An impedance difference at the resonant and anti-resonant frequencies was 29 dB. In addition, a very excellent electromechanical coupling factor of $k^2$=28% was obtained. These properties remained substantially unchanged even when different direct voltages were applied to the PZT film.

As a result of measurement of the FBAR device of Comparative Example 3, on the other hand, resonance and anti-resonance were hardly observed in the absence of direct voltage applied to the PZT film.

From this, it is appreciated that the FBAR device using the multilayer thin film of the present invention possesses very excellent properties.

EFFECT OF THE INVENTION

According to the present invention, it is possible to obtain a ferroelectric film having any desired thickness, wherein the metal thin film and oxide thin film are interposed between the Si substrate and the ferroelectric thin film, so that stresses applied on the ferroelectric thin film are relaxed to ensure preferential (001) orientation, as well as its fabrication process.

Furthermore, when the a-axis lattice constant of the material used for the cubic oxide thin film is smaller than the a-axis lattice constant of the material used for the ferroelectric thin film to be formed thereon, an additional effect of elastic distortion due to the misfit is obtainable. The ferroelectric film can be elongated in the c-axis direction by making use of this effect, so that the ferroelectric film can have preferential (001) orientation. It is also possible to achieve a process for the fabrication of such a ferroelectric film.

The multilayer thin film of the present invention may be applied to various electron devices. For instance, if the multilayer thin film is processed by semiconductor processes, it may then be applied to semiconductor memories constructed as capacitors and FET gates, thin-film ferroelectric devices such as infrared sensors, recording media for recording information by polarization reversal of ferroelectrics by AFT (atomic force microscope) probes or the like, thin-film vibrators such as FBARs, thin-film VCOs and thin-film filters used for mobile communications equipment, thin-film piezoelectric devices used for liquid injectors, and so on.

What we claim is:

1. A multilayer thin film formed on a substrate, which comprises in the following sequential order:

a substrate, a buffer layer comprising an oxide, a metal thin film, an oxide thin film and a preferentially (001) oriented ferroelectric thin film, wherein an a-axis lattice constant of a material used for said oxide thin film is smaller than an a-axis lattice constant of a material used for said ferroelectric thin film.

2. The multilayer thin film of claim 1, wherein said oxide thin film has electrical conductivity.

3. The multilayer thin film of claim 1, wherein an oxide thin film is formed on said ferroelectric thin film.

4. The multilayer thin film of claim 1, wherein said oxide thin film is a perovskite oxide.

5. The multilayer thin film of claim 1, wherein said metal thin film contains at least one of Pt, Ir, Pd, Rh and Au.

6. The multilayer thin film of claim 1, wherein said metal thin film has a thickness of 50 to 500 nm.

7. The multilayer thin film of claim 1, wherein said ferroelectric thin film contains Pb and Ti.

8. The multilayer thin film of claim 1, wherein said buffer thin film contains a zirconium oxide, a rare earth element oxide or a zirconium oxide with a part of Zr substituted by a rare earth element or an alkaline earth element.

9. The multilayer thin film of claim 1, wherein said substrate is an Si (100) single crystal substrate.

10. An electron device comprising a multilayer thin film as recited in claim 1.

11. A process for fabricating a multilayer thin film according to claim 1 by comprising, in the following sequential order:

forming a buffer layer comprising an oxide on a substrate, forming a metal thin film on the buffer layer, forming an oxide thin film on the metal thin film, and forming a preferentially (001) oriented ferroelectric thin film on the oxide thin film.

12. The multilayer thin film of claim 1, wherein the ferroelectric thin film comprises a domain structure in which the proportion of (001) domains is larger than the proportion of (100) domains.

13. The multilayer thin film of claim 1, wherein at least one of the buffer layer, the metal thin film, the oxide thin film and the ferroelectric thin film has been epitaxially grown.

14. The multilayer thin film of claim 1, wherein the buffer layer comprises a $ZrO_2$ thin film and a $Y_2O_3$ thin film; and the $Y_2O_3$ thin film is closer than the $ZrO_2$ thin film to the metal thin film.

* * * * *